United States Patent
Chang et al.

(10) Patent No.: US 7,592,240 B2
(45) Date of Patent: Sep. 22, 2009

(54) METHOD FOR FORMING A GATE STRUCTURE THROUGH AN AMORPHOUS SILICON LAYER AND APPLICATIONS THEREOF

(75) Inventors: Jen Chieh Chang, Hsinchu (TW); Shih-Chi Lai, Hsinchu (TW); Yi Fu Chung, Hsinchu (TW); Tun-Fu Hung, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 340 days.

(21) Appl. No.: 11/202,698

(22) Filed: Aug. 12, 2005

(65) Prior Publication Data
US 2006/0046364 A1 Mar. 2, 2006

(30) Foreign Application Priority Data
Aug. 26, 2004 (TW) .............................. 93125517 A

(51) Int. Cl.
*H01L 21/20* (2006.01)

(52) U.S. Cl. ................ 438/482; 438/657; 257/E21.197
(58) Field of Classification Search ................ 438/482, 438/491, 657; 257/E21.196, E21.197, E21.297
See application file for complete search history.

(56) References Cited

U.S. PATENT DOCUMENTS

| 4,963,506 | A | * | 10/1990 | Liaw et al. .................. 438/482 |
| 5,256,566 | A | * | 10/1993 | Bailey ......................... 438/684 |
| 5,589,233 | A | * | 12/1996 | Law et al. ................... 438/482 |
| 6,410,434 | B1 | * | 6/2002 | Mani .......................... 438/680 |

* cited by examiner

*Primary Examiner*—Chandra Chaudhari
(74) *Attorney, Agent, or Firm*—Bacon & Thomas, PLLC

(57) ABSTRACT

A fabrication method for forming a gate structure through an amorphous silicon layer includes providing a substrate layer, forming an amorphous silicon layer of a selected thickness on the substrate layer at a reaction temperature between about 520° C. and 560° C., and forming a doped amorphous silicon layer in a upper portion of the amorphous silicon layer at a reaction temperature between about 520° C. and 560° C.

27 Claims, 4 Drawing Sheets

METHOD FOR FORMING A GATE STRUCTURE THROUGH AN AMORPHOUS SILICON LAYER AND APPLICATIONS THEREOF

CROSS-REFERENCES TO RELATED APPLICATIONS

This application claims priority from R.O.C. Patent Application No. 093125517, filed Aug. 26, 2004, the entire disclosure of which is incorporated herein by reference.

BACKGROUND OF THE INVENTION

This present invention relates to a fabrication method for forming a gate structure through an amorphous silicon layer and applications thereof, and more particularly to a fabrication method that uses a same manufacturing process and a same in situ chamber to form an amorphous silicon layer and the applications thereof.

Metal-Oxide-Semiconductor Field-Effect Transistor (MOSFET) is an important basic electronic element in the VLSI technology. It is formed by stacking a metal layer, an oxide layer and a semiconductor layer that have different thicknesses together from up and down in this order. In the conventional fabrication process, silicon is the primary source of the semiconductor layer. The oxide layer mainly is silicon dioxide. The metal layer is made from polysilicon which is characteristically similar to the silicon substrate to be in contact with the oxide layer.

In the conventional techniques, the polysilicon is formed through low pressure chemical vapor deposition (LPCVD) by heating and decomposing silane (i.e., $SiH_4$). The reaction formula is as follow:

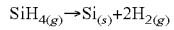

$$SiH_{4(g)} \rightarrow Si_{(s)} + 2H_{2(g)}$$

When the temperature rises to 575° C. to 650° C., the deposited silicon mostly exists in the form of polysilicon. Hence in the practical application for forming the polysilicon, the reaction temperature usually is controlled between 600° C. and 650° C., and the pressure between 0.3 to 0.6 Torr.

After the polysilicon has been formed, in order to reduce the resistance and increase the conductivity, a dope process is applied to the polysilicon by adding a small amount of dopant to transform the polysilicon to an electric conductor.

The resulting structure previously discussed includes a silicon substrate 2, a silicon dioxide film 3 and a doped polysilicon layer 4 to become a planar MOSFET element 1 (referring to FIG. 1).

FIG. 2 shows the structure of a trench MOSFET element 10. It has a vertical gate channel different from the horizontal structure of the planar MOSFET mentioned above. There is a trench 12 filled with polysilicon 14 which is isolated from a silicon area 16 by an insulation film 18. There is a main layer 20 formed in an epitaxial layer 22 by diffusion. A doped area 24 also is formed in the main layer 20 by diffusion. The polysilicon 14 and the insulation film 18 in the trench 12 form respectively a gate structure 26 and a gate dielectric layer 28.

The planar MOSFET element shown in FIG. 1 is used as an example to explain the problems that have occurred in the conventional technique. In general, when the element 1 is undergoing the sequential thermal process, the doped ions (such as boron, arsenic, or phosphorus) easily penetrate the silicon dioxide layer 3 into the silicon substrate 2. This will result in shift of electric characteristics of the MOSFET 1 (such as the threshold voltage, and current of the drain and source) and ineffectiveness of the element.

Moreover, in the conventional fabrication process, in order to prevent the dopant ions in the polysilicon layer 4 from penetrating the silicon dioxide film 3 into the silicon substrate 2, an extra un-doped polysilicon layer 5 is formed between the doped polysilicon layer and the silicon dioxide film 3 (referring to FIG. 3). But even with the un-doped polysilicon layer 5, the dopant still tends to penetrate the silicon dioxide film 3 and the un-doped polysilicon layer 5 through the grain boundary of the doped polysilicon layer 4, and the boundary of the silicon dioxide film 3 and the silicon substrate 2.

BRIEF SUMMARY OF THE INVENTION

Embodiments of the present invention provide a fabrication method for forming a gate structure through an amorphous silicon layer. First, a substrate layer is provided, and a gate dielectric layer is formed on the upper surface of the substrate layer. Next, an amorphous silicon layer of a first selected thickness is formed on the substrate layer under a reaction temperature between about 520° C. and 560° C. Then a doped amorphous silicon layer of a second selected thickness is formed on the amorphous silicon layer under a reaction temperature between about 520° C. and 560° C.

The present invention provides a gate structure which includes, from bottom to top in this order, a gate dielectric layer, an un-doped amorphous silicon layer and a doped amorphous silicon layer. The doped amorphous silicon layer is doped with a selected dopant.

The present invention also provides a method for forming the gate structure. First, provide a wafer in a first temperature range. Next, heat the wafer to a second temperature level. Form a first amorphous silicon layer on the upper surface of the wafer. Then form a second amorphous silicon layer on the upper surface of the first amorphous silicon layer. Fabricate an IC on the wafer. The wafer provided by the invention includes a gate dielectric layer.

The present invention also provides a method for fabricating a power element. First, provide a wafer in a first temperature range. Next, heat the wafer to a second temperature level. Form a first amorphous silicon layer on the upper surface of the wafer. Then form a second amorphous silicon layer on the upper surface of the first amorphous silicon layer. The wafer has at least one trench to form at least one power element. The wafer provided by the invention includes a gate dielectric layer.

The power element provided by the invention includes at least a trench gate which includes at least a trench formed on the substrate, a dielectric layer attached to an inner wall of the trench, and an amorphous silicon layer filled in the trench that has the dielectric layer attached thereon. The amorphous silicon layer includes at least an un-doped amorphous silicon layer and a doped amorphous silicon layer formed on the upper surface of the un-doped amorphous silicon layer.

DETAILED DESCRIPTION OF THE INVENTION

Figure 4:
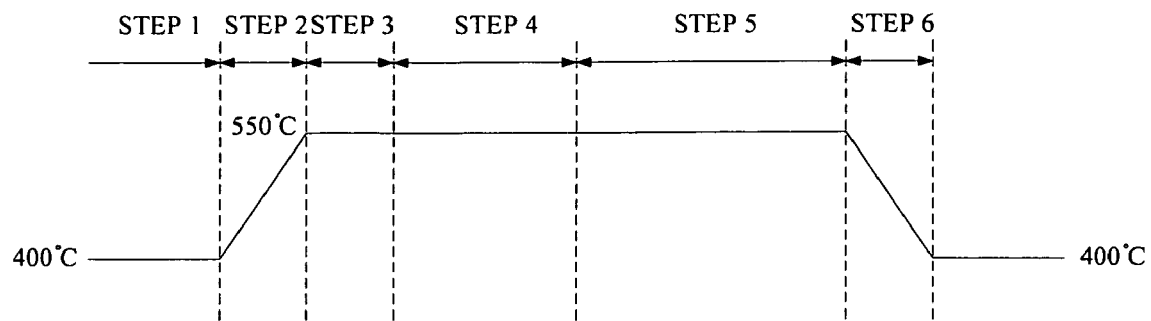
FIG. 4 is a schematic view of fabrication temperature conditions according to an embodiment of the invention.
Figure 5A:
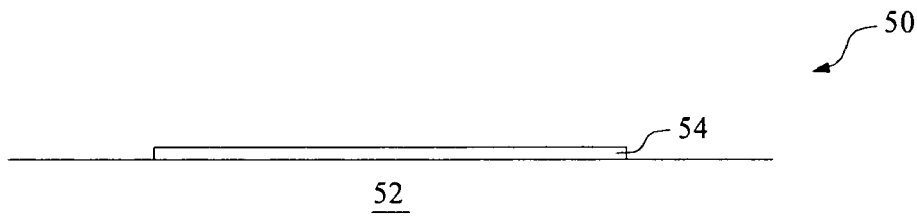
FIG. 5A is a schematic view of step 1 for fabricating a planar MOSFET element according to an embodiment of the invention.

FIG. 4 illustrates the temperature conditions of fabricating a MOSFET element 50 shown in the process of FIG. 5. At step 1 shown in FIG. 4, a batch of wafers loaded in a boat is transported to a chamber (such as heating furnace duct). Then the wafers are carried individually by a robotic arm from the wafer holder to a dock for forming the gate structure through the amorphous silicon layer. It is to be noted that before the gate structure is formed on a silicon substrate 52, a dielectric layer 54 of a thickness about 60 to 1200 Å has already being formed on the silicon substrate 52 (referring to FIG. 5A). The dielectric layer 54 may be formed by high temperature oxidizing known in the art. Moreover, before forming the gate structure on the silicon substrate 52, the system conditions of the entire fabrication process also are adjusted to the optimum condition (referring to step 2 in FIG. 4). The system conditions include the temperature and pressure of the in situ chamber, and gas flow. In an embodiment of the invention, the temperature of the in situ chamber is between about 520° C. and 560° C., preferably about 550° C.; the pressure of the in situ chamber is between about 0.2 and 0.8 torr, preferably about 0.25 torr; and the gas flow is between about 50 and 1000 sccm, preferably about 200 sccm.

Figure 1:
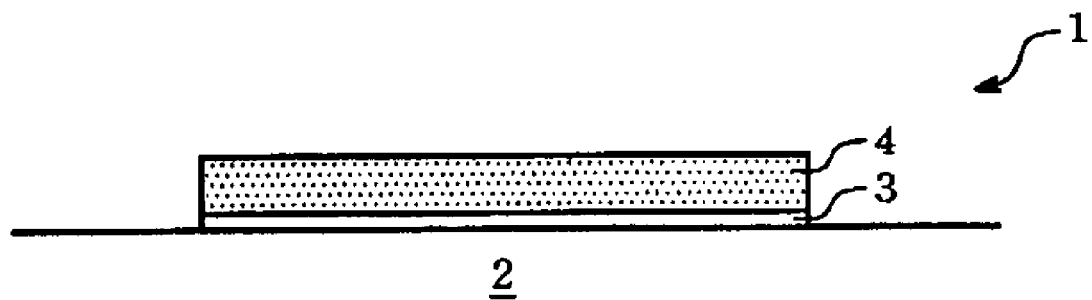
FIG. 1 is a fragmentary cross section of a conventional planar MOSFET element structure.
Figure 3:
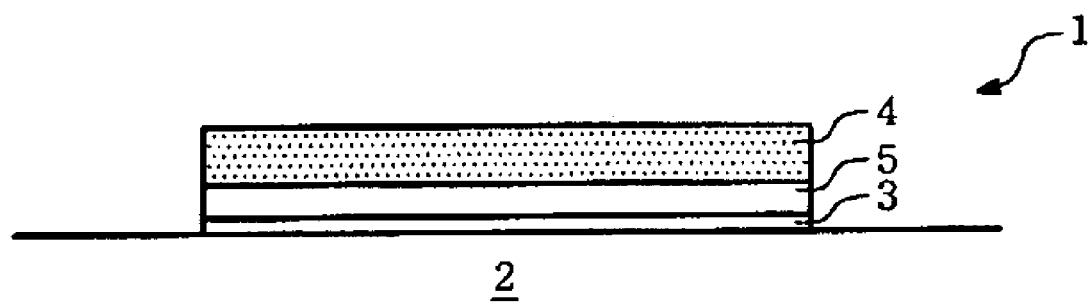
FIG. 3 is a schematic view of forming a conventional planar MOSFET element structure.
Figure 2:
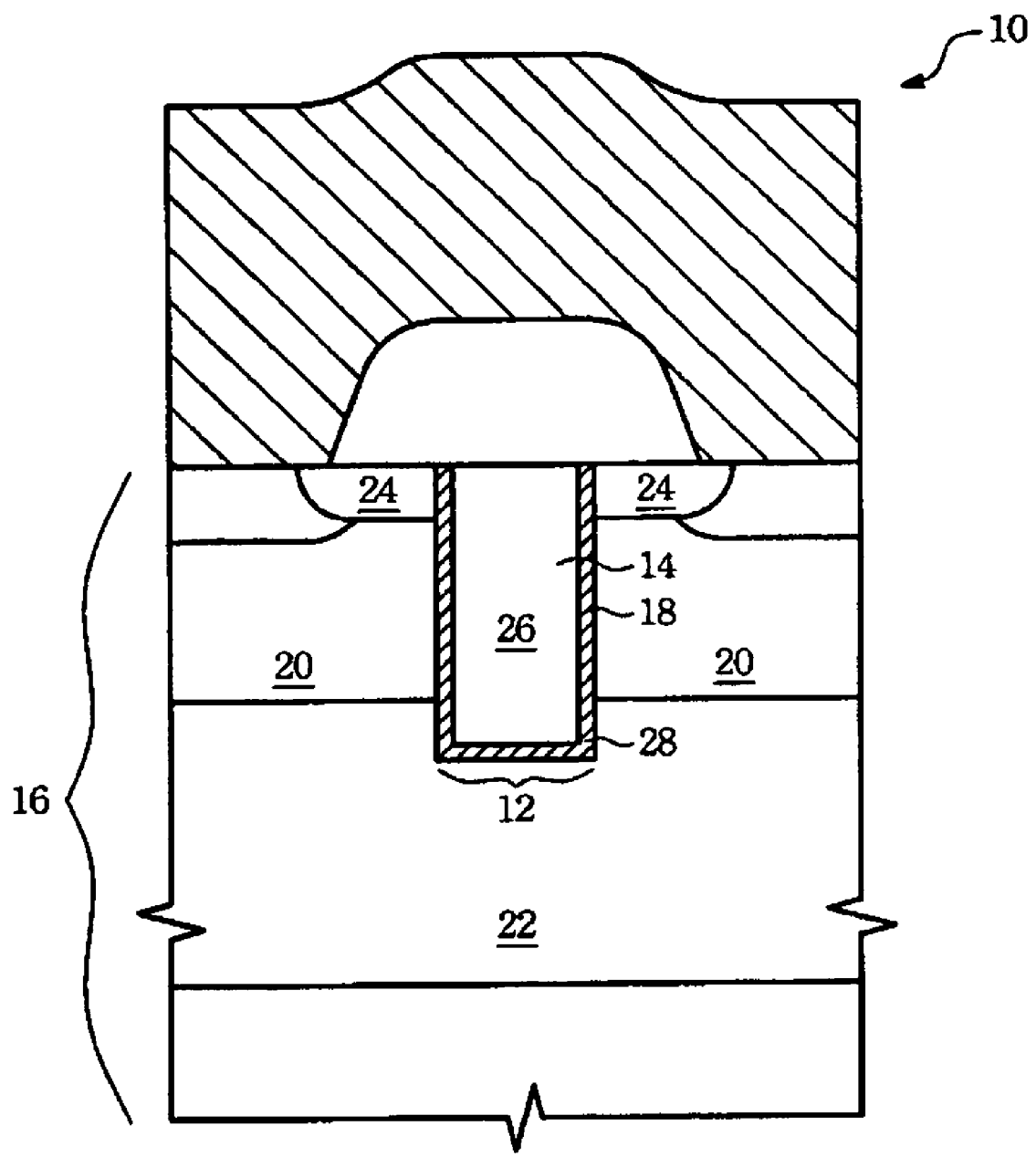
FIG. 2 is a fragmentary cross section of a conventional trench MOSFET element structure.
Figure 5B:
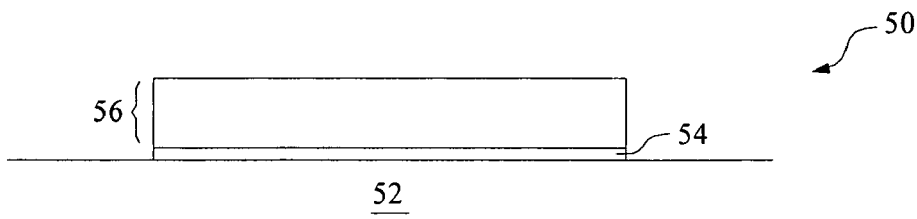
FIG. 5B is a schematic view of step 2 for fabricating a planar MOSFET element according to an embodiment of the invention.

Once the system conditions of reaction have been maintained at the optimum condition (referring to step 3 in FIG. 3), form an amorphous silicon layer 56 is formed on the upper surface of the gate dielectric layer 54 in the same in situ chamber (referring to step 4 in FIG. 4, and FIG. 5B).

Forming of the amorphous silicon layer 56 may be accomplished through the conventional LPCVD by heating and decomposing silane (i.e., $SiH_4$). The reaction formula is as follow:

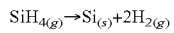

When the reaction temperature is lower than 575° C., the deposited silicon exists in an amorphous silicon state.

By means of the reaction set forth above, the amorphous silicon layer 56 at a first selected thickness T1 is formed on the upper surface of the gate dielectric layer 54 (referring to step 4 in FIG. 4). Next is a doping process on the amorphous silicon layer 56 in the same in situ chamber to form a doped amorphous silicon layer 58 at a second selected thickness T2 in the amorphous silicon layer 56 (referring to step 5 in FIG. 4 and FIG. 5C). Namely, an upper layer of the amorphous silicon layer 56 is transformed to a doped amorphous silicon layer 58 through the doping process of the invention. And the second thickness T2 is within the first thickness T1 and smaller than the first thickness T1. The un-doped portion of the amorphous silicon layer 56 is an un-doped amorphous silicon layer 57. The gate dielectric layer 54, un-doped amorphous silicon layer 56 and the doped amorphous silicon layer 58 jointly form the gate structure 60 of the MOSFET element 50 of the present embodiment.

In another embodiment of the present invention, after having formed the un-doped amorphous silicon layer 57 of the first selected thickness T1 (referring to step 4 in FIG. 4), the doped amorphous silicon layer 58 of the second selected thickness T2 may be formed on the upper surface of the un-doped amorphous silicon layer 57 through the same process in the same in situ chamber through the following reaction:

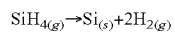

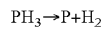

As previous discussed, the gate structure of the MOSFET element 50 includes the doped amorphous silicon layer 58 and un-doped amorphous silicon layer 57. According to specific embodiments of the invention, in the doping process, a selected dopant such as B, As or P is doped in the target layer. The ratio of the first selected thickness T1 and the second selected thickness T2 is about 4 to 40.

Figure 5C:
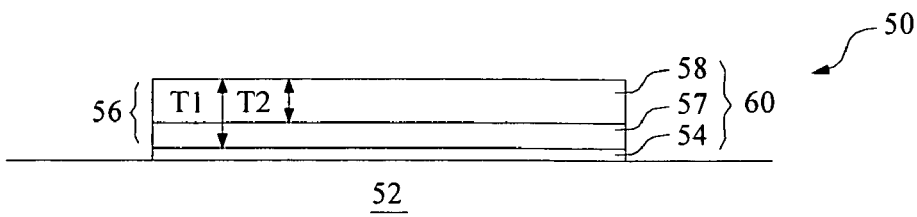
FIG. 5C is a schematic view of step 3 for fabricating a planar MOSFET element according to an embodiment of the invention.

In addition to the gate structure set forth above, the invention also provides a MOSFET element structure. Referring to FIG. 5C, the MOSFET element 50 includes a substrate layer 52 (i.e., the silicon substrate previously discussed), a gate dielectric layer 54, an un-doped amorphous silicon layer 57 and a doped amorphous silicon layer 58. The substrate layer 52 mainly includes silicon. The gate dielectric layer 54 is located on the upper surface of the substrate layer 52. The un-doped amorphous silicon layer 56 is located on the upper surface of the gate dielectric layer 54. In an embodiment of the invention, the doped amorphous silicon layer 58 is formed by doping the upper part of the un-doped amorphous silicon layer. In another embodiment of the invention, the doped amorphous silicon layer 58 is located on the upper surface of the un-doped amorphous silicon layer 56. As previously discussed, the doped amorphous silicon layer 58 is doped with a selected dopant such as B, As or P.

Therefore, the invention also provides a method for forming the MOSFET element 50. Referring to FIG. 5, first, provide a wafer 52 which has a gate dielectric layer 54 formed on the upper surface. Place the wafer 52 in an in situ chamber which is in a first temperature range. Heat the wafer 52 until reaching a second temperature range. Form a first amorphous silicon layer 56 on the upper surface of the gate dielectric layer 52. Proceed with a doping process on the first amorphous silicon layer 56 to form a second amorphous silicon layer 58 in the first amorphous silicon layer 56. Finally, cool the temperature of the wafer to a third temperature range. The second amorphous silicon layer 58 is a doped amorphous silicon layer. The portion of the amorphous silicon layer 56 not being doped is an un-doped amorphous silicon layer 57. It is to be noted that, in an embodiment, the wafer 52 is for fabricating an IC. In another embodiment, the wafer 52 includes at least one trench to form at least one power element (details will be discussed later). The first temperature range is about 300° C. to 500° C., preferably about 400° C.; the second temperature range is about 520° C. to 560° C., preferably about 550° C.; the third temperature range is about 300° C. to 500° C., preferably about 400° C.

Figure 6:
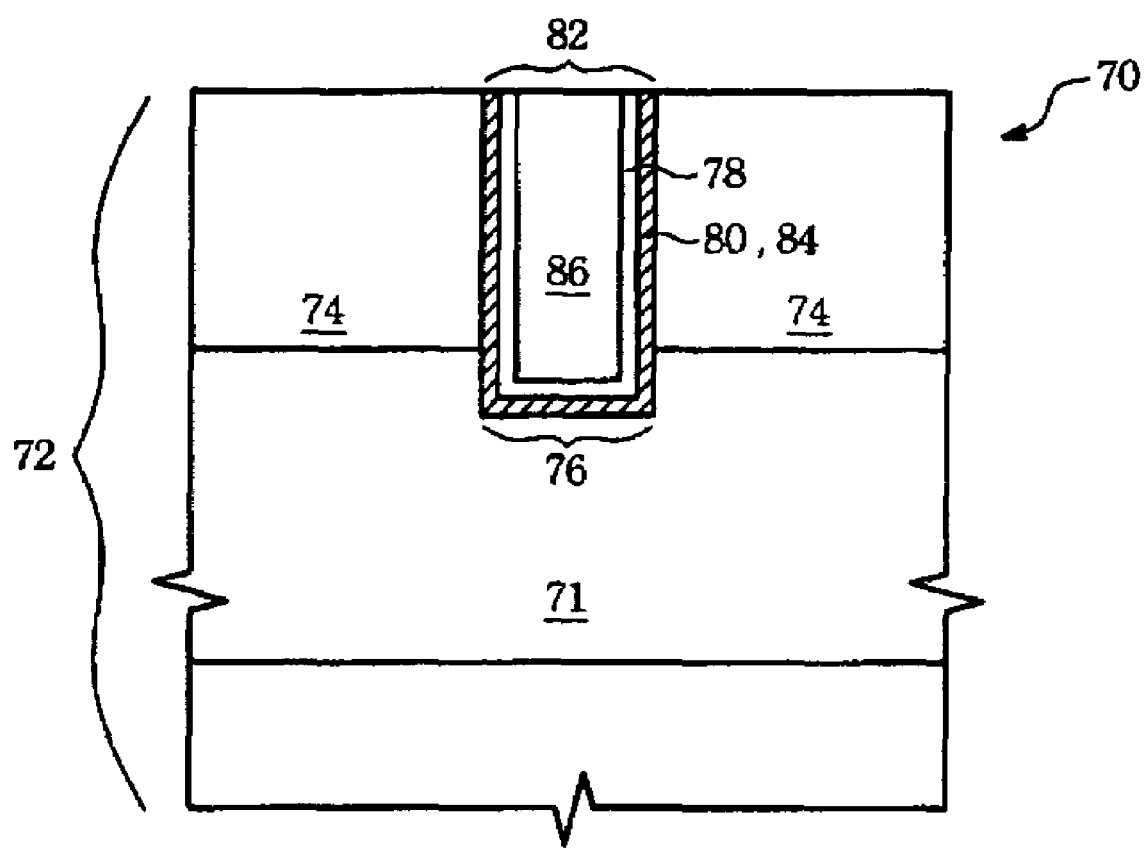
FIG. 6 is a fragmentary cross section of a trench MOSFET element structure according to an embodiment of the invention.

The invention also provides a power element. As seen in FIG. 6, the power element 70 includes at least a substrate 72 which has a trench 76. There is an insulation film 80 formed on an inner wall of the trench 76. A first amorphous silicon layer 78 is formed on the surface of the insulation layer 80, then a second amorphous silicon layer 86 fills the trench 76.

A main body layer 74 is formed in an epitaxial layer 71 by diffusion. It is to be noted that the insulation layer 80 in the trench 76 is a gate dielectric layer 84 of a gate structure 82. As previously discussed, the first amorphous silicon layer 78 is an un-doped amorphous silicon layer, while the second amorphous silicon layer 86 is a doped amorphous silicon layer.

The invention has the following advantages:

1. The invention uses an amorphous silicon layer to replace the polysilicon layer of the conventional gate structure. In terms of material characteristics, the amorphous silicon layer does not have grain boundary, and thus can prevent current leakage that occurs in the conventional techniques.

2. The present fabrication processes mostly are low temperature oriented. The fabrication temperature for forming the amorphous silicon layer in the invention is lower than the temperature of fabricating the polysilicon layer in the conventional techniques. Thus the invention is more adaptable to the present low temperature fabrication process.

3. Because of the reason mentioned above, dopant is less likely to be diffused at the lower temperature fabrication process. Hence the elements produced by the invention have improved electric characteristics compared with those fabricated by the conventional techniques.

4. In the conventional techniques, forming two polysilicon layers on the upper surface of the silicon substrate requires about eight hours (four hours for one polysilicon layer). And they have to be formed in two different chambers. In the invention, two amorphous silicon layers are formed in the same in situ chamber by the same fabrication process, thus the required fabrication time is much less than the conventional techniques. And manufacturing efficiency improves.

5. The gate current leakage of the elements fabricated by the invention is about 1000 times less than the elements fabricated by the conventional techniques.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A fabrication method for forming a gate structure through an amorphous silicon layer, comprising:
   providing a semiconductor substrate layer;
   forming a gate dielectric layer;
   forming an undoped amorphous silicon layer on the semiconductor substrate layer at a reaction temperature between about 520° C. and 560° C.; and
   forming a doped amorphous silicon layer by doping an upper portion of the undoped amorphous silicon layer at a reaction temperature between about 520° C. and 560° C.

2. The fabrication method of claim 1, wherein forming a doped amorphous silicon layer comprises doping boron in the upper portion of the undoped amorphous silicon layer.

3. The fabrication method of claim 1, wherein forming a doped amorphous silicon layer comprises doping arsenic in the upper portion of the undoped amorphous silicon layer.

4. The fabrication method of claim 1, wherein forming a doped amorphous silicon layer comprises doping phosphorus in the upper portion of the undoped amorphous silicon layer.

5. A method for forming a gate structure, comprising:
   providing a wafer in a first temperature range;
   heating the wafer to a second temperature range;
   forming a first amorphous silicon layer on the wafer; and
   forming a second amorphous silicon layer by doping an upper portion of the first amorphous silicon layer;
   wherein the wafer is for fabricating an integrated circuit.

6. The method of claim 5, wherein the first temperature range is about 300° C. to 500° C.

7. The method of claim 5, wherein the second temperature range is about 520° C. to 560° C.

8. The method of claim 5, wherein the forming a first amorphous silicon layer is accomplished through a first chemical vapor deposition process.

9. The method of claim 8, wherein the first chemical vapor deposition process uses $SiH_4$ gas.

10. The method of claim 5, wherein the forming a second amorphous silicon layer is accomplished through a second chemical vapor deposition process.

11. The method of claim 10, wherein the second chemical vapor deposition process uses $SiH_4$ gas.

12. The method of claim 10, wherein the second chemical vapor deposition process uses $PH_3$ gas.

13. The method of claim 5 further comprising cooling the wafer in a third temperature range.

14. The method of claim 13, wherein the third temperature range is about 300° C. to 500° C.

15. A method for fabricating a power element, comprising:
   providing a wafer in a first temperature range;
   heating the wafer to a second temperature range;
   forming a first amorphous silicon layer on the wafer; and
   forming a second amorphous silicon layer by doping an upper portion of the first amorphous silicon layer;
   wherein the wafer has at least one trench to form at least one power element.

16. The method of claim 15, wherein the first temperature range is about 300° C. to 500° C.

17. The method of claim 15, wherein the second temperature range is about 520° C. to 560° C.

18. The method of claim 15, wherein the forming a first amorphous silicon layer is accomplished through a first chemical vapor deposition process.

19. The method of claim 18, wherein the first chemical vapor deposition process uses $SiH_4$ gas.

20. The method of claim 15, wherein the forming a second amorphous silicon layer is accomplished through a second chemical vapor deposition process.

21. The method of claim 20, wherein the second chemical vapor deposition process uses $SiH_4$ gas.

22. The method of claim 20, wherein the second chemical vapor deposition process uses $PH_3$ gas.

23. The method of claim 15 further comprising cooling the wafer in a third temperature range.

24. The method of claim 23, wherein the third temperature range is about 300° C. to 500° C.

25. The method of claim 15, wherein the trench includes a dielectric layer.

26. The method of claim 15, wherein the trench includes an oxide layer on a bottom thereof.

27. The method of claim 15, wherein the power element is a trench power element.

* * * * *

UNITED STATES PATENT AND TRADEMARK OFFICE
CERTIFICATE OF CORRECTION

PATENT NO. : 7,592,240 B2  
APPLICATION NO. : 11/202698  
DATED : September 22, 2009  
INVENTOR(S) : Chang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 737 days.

Signed and Sealed this

Twenty-first Day of September, 2010

David J. Kappos  
*Director of the United States Patent and Trademark Office*